(12) United States Patent
Zheng et al.

(10) Patent No.: US 9,002,214 B2
(45) Date of Patent: Apr. 7, 2015

(54) WAVELENGTH-SELECTABLE LASER DEVICE AND APPARATUS AND SYSTEM INCLUDING SAME

(75) Inventors: Jun Zheng, Missouri City, TX (US); Stefan J. Murry, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 234 days.

(21) Appl. No.: 13/539,961

(22) Filed: Jul. 2, 2012

(65) Prior Publication Data

US 2013/0016974 A1 Jan. 17, 2013

Related U.S. Application Data

(63) Continuation-in-part of application No. 13/357,130, filed on Jan. 24, 2012.

(60) Provisional application No. 61/508,034, filed on Jul. 14, 2011.

(51) Int. Cl.
*H04B 10/50* (2013.01)
*H04J 14/02* (2006.01)
(Continued)

(52) U.S. Cl.
CPC ......... *H04J 14/0282* (2013.01); *H04J 14/0249* (2013.01); *H04J 14/0245* (2013.01); *H01S 5/4062* (2013.01); *H01S 5/141* (2013.01); *H01S 5/4087* (2013.01)

(58) Field of Classification Search
CPC ............... H01S 5/141–5/143; H04B 10/506
USPC .......................................................... 398/201
See application file for complete search history.

(56) References Cited

U.S. PATENT DOCUMENTS 5,790,287 A 8/1998 Darcie et al.
5,946,331 A 8/1999 Amersfoort et al.
(Continued)

FOREIGN PATENT DOCUMENTS

EP 2337240 A1 6/2011
WO 2013010166 A1 1/2013

OTHER PUBLICATIONS

PCT International Search Report and Written Opinion dated Oct. 5, 2012 received in corresponding PCT Application No. PCT/US2012/046902, 9 pgs.
(Continued)

*Primary Examiner* — Nathan Curs
(74) *Attorney, Agent, or Firm* — Grossman Tucker Perreault & Pfleger, PLLC; Norman S. Kinsella

(57) ABSTRACT

A wavelength-selectable laser device generally includes an array of laser emitters and a filtered external cavity for filtering light emitted from the laser emitters and reflecting different wavelengths back to each of the laser emitters such that lasing occurs at different wavelengths for each of the laser emitters. Each laser emitter includes a gain region that emits light across a plurality of wavelengths including, for example, channel wavelengths in an optical communication system. The filtered external cavity may include a dispersive optical element that receives the light from each of the laser emitters at different angles and passes or reflects different wavelengths of the light at different angles such that only wavelengths associated with the respective laser emitters are reflected back to the respective laser emitters. By selectively emitting light from one or more of the laser emitters, one or more channel wavelengths may be selected for lasing and transmission.

18 Claims, 4 Drawing Sheets

(51) Int. Cl.
 *H01S 5/40* (2006.01)
 *H01S 5/14* (2006.01)

(56) References Cited

U.S. PATENT DOCUMENTS

| | | | |
|---|---|---|---|
| 6,091,743 A | 7/2000 | Yang | |
| 6,295,308 B1 | 9/2001 | Zah | |
| 6,661,814 B1 | 12/2003 | Chapman et al. | |
| 7,123,406 B2 | 10/2006 | Shin et al. | |
| 7,313,157 B2 | 12/2007 | Sorin et al. | |
| 7,965,949 B1 | 6/2011 | Wach | |
| 8,422,124 B2 | 4/2013 | Lee et al. | |
| 8,559,821 B2 | 10/2013 | Wen et al. | |
| 8,606,107 B2 | 12/2013 | Bai et al. | |
| 2001/0017960 A1 | 8/2001 | Terahara | |
| 2002/0154661 A1* | 10/2002 | Hoose et al. | 372/6 |
| 2004/0067059 A1 | 4/2004 | Song et al. | |
| 2004/0076199 A1 | 4/2004 | Wipiejewski et al. | |
| 2005/0078359 A1 | 4/2005 | Kim et al. | |
| 2005/0135449 A1 | 6/2005 | Sorin et al. | |
| 2005/0185262 A1 | 8/2005 | Yun et al. | |
| 2005/0213618 A1 | 9/2005 | Sochava et al. | |
| 2006/0115271 A1 | 6/2006 | Hwang et al. | |
| 2006/0215713 A1 | 9/2006 | Flanders et al. | |
| 2006/0256831 A1 | 11/2006 | Volodin et al. | |
| 2007/0047608 A1 | 3/2007 | Volodin et al. | |
| 2007/0133647 A1 | 6/2007 | Daiber | |
| 2007/0223552 A1* | 9/2007 | Muendel et al. | 372/50.12 |
| 2008/0259972 A1 | 10/2008 | Heanue et al. | |
| 2008/0267246 A1 | 10/2008 | Volodin et al. | |
| 2009/0074019 A1 | 3/2009 | Wong et al. | |
| 2009/0154939 A1 | 6/2009 | Kim et al. | |
| 2009/0245799 A1* | 10/2009 | Habel et al. | 398/79 |
| 2010/0266283 A1 | 10/2010 | Beckett | |
| 2011/0033192 A1* | 2/2011 | Daiber et al. | 398/183 |
| 2011/0038635 A1 | 2/2011 | Bai | |
| 2011/0135309 A1 | 6/2011 | Lee et al. | |
| 2011/0216789 A1 | 9/2011 | Docter et al. | |
| 2011/0222855 A1 | 9/2011 | Kim et al. | |
| 2012/0087667 A1 | 4/2012 | Bulthuis | |
| 2013/0089322 A1* | 4/2013 | Ohlen | 398/25 |

OTHER PUBLICATIONS

PCT International Search Report and Written Opinion dated Oct. 22, 2012 received in related PCT Application No. PCT/US2012/046912, 8 pgs.
Lee, San-Liang et al, "Trend and Applications of Tunable Semiconductor Lasers", Optoelectronic Materials and Devices II, Proc. of SPIE vol. 6782, 67821H, 2007, Taipei, Taiwan R.O.C., 10 pgs.
US Office Action mailed Aug. 9, 2013, received in related U.S. Appl. No. 13/359,847, 15 pgs.
PCT International Search Report and Written Opinion dated Dec. 30, 2013 received in related PCT Application No. PCT/US2013/063213, 8 pgs.
US Office Action mailed Feb. 10, 2014, received in related U.S. Appl. No. 13/359,847, 16 pgs.
US Office Action mailed Apr. 1, 2014, received in related U.S. Appl. No. 13/644,113, 20 pgs.
US Office Action mailed Oct. 22, 2014, received in related U.S. Appl. No. 13/644,113, 23 pgs.
US Office Action mailed Nov. 7, 2014, received in related U.S. Appl. No. 13/357,130, 18 pgs.
Harvey, K.C. and Myatt, C.J., "External-cavity diode laser using a grazing-incidence diffraction grating", Optics Letters, vol. 16, No. 12, Dallas, Texas, Jun. 15, 1991, pp. 910-912.

* cited by examiner

WAVELENGTH-SELECTABLE LASER DEVICE AND APPARATUS AND SYSTEM INCLUDING SAME

CROSS-REFERENCE TO RELATED APPLICATIONS

The present application claims the benefit of U.S. Provisional Patent Application Ser. No. 61/508,034 filed on Jul. 14, 2011 and is a continuation-in-part of U.S. patent application Ser. No. 13/357,130 filed on Jan. 24, 2012, which are fully incorporated herein by reference.

TECHNICAL FIELD

The present invention relates to wavelength division multiplexed (WDM) optical systems, networks, and methods and more particularly, to a wavelength-selectable laser device for use in tunable transmitters or transceivers in a WDM passive optical network (PON).

BACKGROUND INFORMATION

Optical communications networks have been deployed for many years. Originally, these networks were generally "point to point" type networks including a transmitter and a receiver connected by an optical fiber. Such networks are relatively easy to construct but deploy many fibers to connect multiple users. As the number of subscribers connected to the network increases, the fiber count also increases rapidly and the expense of deploying and managing many fibers becomes complex and expensive.

A passive optical network (PON) addresses this problem by using a single "trunk" fiber from a transmitting end of the network, such as an optical line terminal (OLT), to a remote branching point, which may be up to 20 km or more. Each subscriber may be connected to the network utilizing a much shorter fiber span forming an architecture sometimes referred to as "tree and branch." One challenge in developing such a PON is utilizing the capacity in the trunk fiber efficiently in order to transmit the maximum possible amount of information on the trunk fiber.

To improve efficiency, PONs have used "time domain multiplexing" by assigning each subscriber on the PON a particular time slot for transmission of its data along the trunk fiber. Each subscriber is allowed to transmit during its assigned time slot, and these slots are synchronized at both the transmitter and receiver such that the receiver knows the time slot (and thus the transmitter) of a transmitted signal. In this way, many transmitters can share the same fiber without fear of multiple transmitters sending data at the same time and confusing the receiver. Standards such as gigabit PON (G-PON) and Ethernet-based PON (E-PON), for example, utilize this time-dependant approach.

Although TDM-PON systems work, the TDM approach is inefficient because the system should allow sufficient time between different transmitter time slots to prevent confusion at the receiving end. Also, noise in this type of system is cumulative across all the transmitters in the PON. To avoid unwanted noise, transmitters other than the one currently transmitting may be turned off and then turned on rapidly when it is time to transmit data, without providing much stabilization time. This "burst mode" transmission makes it challenging to increase data rates in a TDM-PON system.

TDM also does not make efficient use of the bandwidth available on the fiber. Optical fiber has the ability to carry many different signals simultaneously, without interfering, as long as these different signals are carried on different wavelengths. TDM-PON systems utilize only a few wavelengths and therefore do not utilize much of the fundamental bandwidth available on the optical fiber. Similar to radio transmissions utilizing different frequencies to carry different signals, fiber optic communications networks may increase the amount of information carried on a single optical fiber by multiplexing different optical signals on different wavelengths using wavelength division multiplexing (WDM).

In a WDM-PON, a single trunk fiber carries data to and from an optical branching point and the branching point provides a simple routing function by directing signals of different wavelengths to and from individual subscribers. In this case, each subscriber is assigned a particular wavelength on which to send and/or receive data. The WDM-PON thus allows much greater bandwidth because each transmitter is allowed to transmit at a higher data rate and for a longer period of time.

A challenge in a WDM-PON, however, is designing a network that will allow the same transmitter to be used in an optical networking terminal (ONT) at any subscriber location. For ease of deployment and maintenance in a WDM-PON, it is desirable to have a "colorless" ONT whose wavelength can be changed or tuned such that a single device could be used in any ONT on the PON. With a "colorless" ONT, an operator only needs to have a single, universal transmitter or transceiver device that can be employed at any subscriber location.

One or more tunable laser sources may be used to provide multiple optical signals at different wavelengths in a WDM system or network such as a WDM-PON. Similar to a tuner section of a radio transmitter allowing the transmitter to select the frequency on which to transmit, a tunable laser has the capability to select different wavelengths on which to transmit optical signals. Various different types of tunable lasers have been developed over the years, but most of these were developed for high-capacity backbone connections to achieve high performance and at a relatively high cost. Many tunable laser sources rely on continuous tuning mechanisms and may be difficult and expensive to construct because of extremely tight manufacturing tolerances. Many continuously tunable lasers also require an external means to "lock" the wavelength similar to a phase-locked loop or crystal reference oscillator in a radio tuner. These wavelength lockers are used because the continuously tunable designs are often highly sensitive to external conditions that can cause the wavelength to drift if not corrected. Conditions such as temperature or external electrical or magnetic fields, for example, can cause drift in some continuously-tunable laser designs.

Many WDM-PON applications have lower data rates and shorter transmission distances as compared to high-capacity, long-haul WDM systems, and thus a lower performance and lower cost laser may suffice. Also, continuous tuning may not be necessary in WDM-PON applications, although the ability to select a wavelength from among several wavelengths (e.g., in a grid of channel wavelengths) is desirable. In some of these applications, the wavelength may be selected only once in the lifetime of the laser (i.e., when it is initially installed) and this wavelength may not need to be changed again.

BRIEF DESCRIPTION OF THE DRAWINGS

These and other features and advantages will be better understood by reading the following detailed description, taken together with the drawings wherein.

DETAILED DESCRIPTION

A wavelength-selectable laser device, consistent with embodiments described herein, generally includes an array of laser emitters and a filtered external cavity for filtering light emitted from the laser emitters and reflecting different wavelengths back to each of the laser emitters such that lasing occurs at different wavelengths for each of the laser emitters. Each of the laser emitters includes a gain region that emits light across a plurality of wavelengths including, for example, channel wavelengths in an optical communication system. The filtered external cavity may include a dispersive optical element that receives the light from each of the laser emitters at different angles and passes or reflects different wavelengths of the light at different angles such that only wavelengths associated with the respective laser emitters are reflected back to the laser emitters. By selectively emitting light from one or more of the laser emitters, one or more channel wavelengths may be selected for lasing and transmission.

The wavelength-selectable laser device may be used, for example, in a tunable transmitter, to generate an optical signal at a selected channel wavelength and/or in a multiplexing optical transmitter to generate and combine optical signals at multiple different channel wavelengths. In one application, the wavelength-selectable laser device may be used in optical transmitters or transceivers in a wavelength division multiplexed (WDM) optical system. A wavelength-selectable laser device may be used, for example, in a tunable transmitter or transceiver in a WDM system such as an optical networking terminal (ONT) or optical networking unit (ONU) in a WDM passive optical network (PON) to select the appropriate transmission channel wavelength for the ONT/ONU. A wavelength-selectable laser device may also be used, for example, in an optical line terminal (OLT) in a WDM-PON to provide multiple optical signals at different channel wavelengths.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. The term "coupled" as used herein refers to any connection, coupling, link or the like by which signals carried by one system element are imparted to the "coupled" element and "optically coupled" refers to coupling such that light from one element is imparted to another element. Such "coupled" devices are not necessarily directly connected to one another and may be separated by intermediate components or devices that manipulate or modify such signals.

Figure 1:
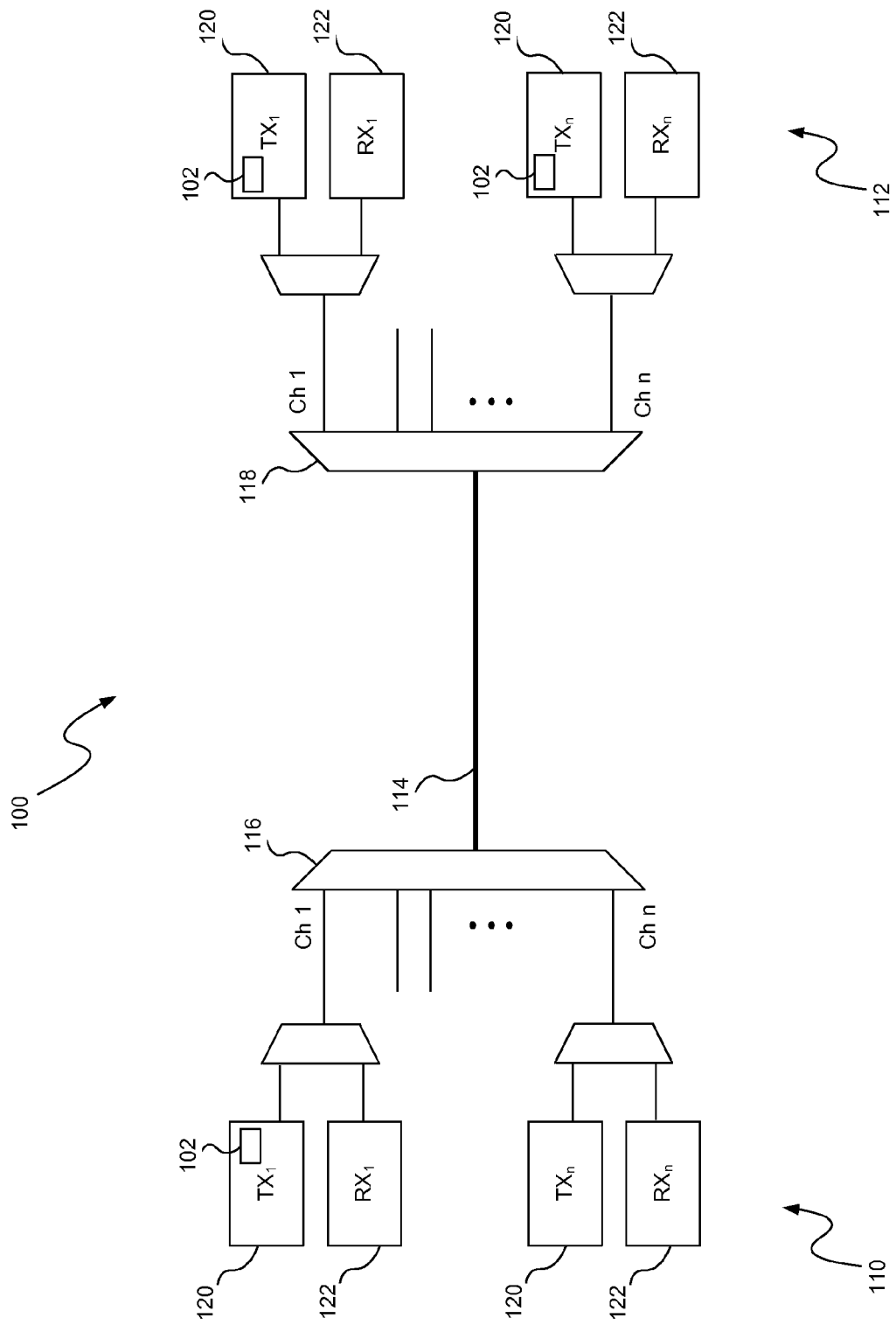
FIG. 1 is a diagrammatic view of a wavelength division multiplexed (WDM) optical communication system including a wavelength-selectable laser device, consistent with an embodiment.

Referring to FIG. 1, a WDM optical communication system 100 including one or more wavelength-selectable laser devices 102, consistent with embodiments of the present disclosure, is shown and described. The WDM system 100 includes one or more terminals 110, 112 coupled at each end of a trunk optical fiber or path 114 for transmitting and receiving optical signals at different channel wavelengths over the trunk optical path 114. The terminals 110, 112 at each end of the WDM system 100 include one or more transmitters 120 (e.g., $TX_1$ to $TX_n$) and receivers 122 (e.g., $RX_1$ to $RX_n$) associated with different channels (e.g., Ch. 1 to Ch. n) for transmitting and receiving optical signals at the different channel wavelengths between the one or more terminals 110, 112.

Each terminal 110, 112 may include one or more transmitters 120 and receivers 122, and the transmitters 120 and receivers 122 may be separate or integrated as a transceiver within a terminal. Optical multiplexers/demultiplexers 116, 118 at each end of the WDM system 100 combine and separate the optical signals at the different channel wavelengths. Aggregate WDM optical signals including the combined channel wavelengths are carried on the trunk optical path 114. One or more of the transmitters 120 may be a tunable transmitter capable of being tuned to the appropriate channel wavelength using a wavelength-selectable laser device 102. Thus, the transmitters 120 may be constructed as universal, tunable transmitters capable of being used in different locations in the WDM system 100 and tuned to the appropriate channel wavelength depending upon the location in the WDM system 100.

Figure 2:
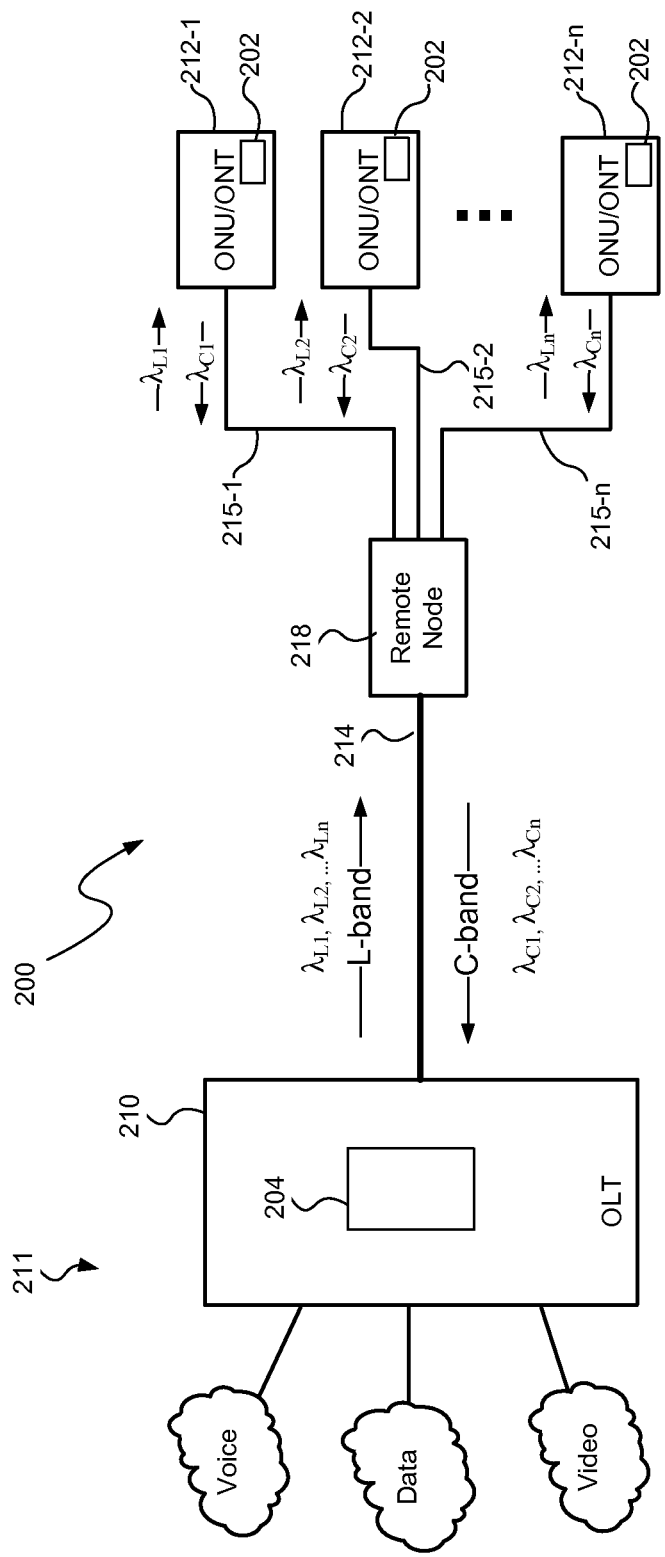
FIG. 2 is a diagrammatic view of a WDM passive optical network (PON) including a wavelength-selectable laser device, consistent with an embodiment.

Referring to FIG. 2, one or more wavelength-selectable laser devices 202, 204, consistent with embodiments of the present disclosure, may be used in transmitters and/or transceivers in a WDM-PON 200. The WDM-PON 200 provides a point-to-multipoint optical network architecture using a WDM system. According to one embodiment of the WDM-PON 200, a central office (CO) 211 including one or more optical line terminals (OLTs) 210 may be coupled to a plurality of optical networking terminals (ONTs) or optical networking units (ONUs) 212-1 to 212-n via optical fibers, waveguides, and/or paths 214, 215-1 to 215-n. A branching point 218 couples the trunk optical path 214 to the separate optical paths 215-1 to 215-n to the ONUs/ONTs 212-1 to 212-n at the subscriber locations. The branching point 218 may include one or more passive coupling devices such as a splitter or optical multiplexer/demultiplexer. The ONUs/ONTs 212-1 to 212-n may be located in homes, businesses or other types of subscriber location or premises.

The WDM-PON 200 may also include additional nodes or network devices, such as Ethernet PON (EPON) or Gigabit PON (GPON) nodes or devices, coupled between the branching point 218 and ONUs/ONTs 212-1 to 212-n at different locations or premises. One application of the WDM-PON 200 is to provide fiber-to-the-home (FTTH) or fiber-to-the-premises (FTTP) capable of delivering voice, data, and/or video services across a common platform. In this application, the CO 211 may be coupled to one or more sources or networks providing the voice, data and/or video.

In the WDM-PON 200, different ONUs/ONTs 212-1 to 212-n may be assigned different channel wavelengths and optical signals may be transmitted on the different channel wavelengths and combined and separated using WDM techniques. One or more of the ONUs/ONTs 212-1 to 212-n may thus include a wavelength-selectable laser device 202 for generating an optical signal at a selected channel wavelength assigned for transmission. The OLT 210 may be configured to generate multiple optical signals at different channel wavelengths and to combine the optical signals into an aggregate WDM optical signal carried on the trunk optical fiber or path 214. The OLT 210 may thus include a wavelength-selectable laser device 204 for generating optical signals at multiple selected channel wavelengths.

In one embodiment, the WDM-PON 200 may use different wavelength bands for transmission of downstream and upstream optical signals relative to the OLT 210. For example, the L-band (e.g., about 1565 to 1625 nm) may be used for downstream transmissions and the C-band (e.g., about 1530 to 1565 nm) may be used for upstream transmissions. The ONUs/ONTs 212-1 to 212-n may thus be assigned different channel wavelengths within the L-band and within the C-band. Transceivers or receivers located within the ONUs/ONTs 212-1 to 212-n may be configured to receive an optical signal on at least one channel wavelength in the L-band. Transceivers or transmitters located within the ONUs/ONTs 212-1 to 212-n may be configured to transmit an optical signal on at least one channel wavelength in the C-band. Other wavelengths and wavelength bands are also within the scope of the system and method described herein.

In the example embodiment, the wavelength-selectable laser device 204 in the OLT 110 may generate optical signals at the different respective channel wavelengths in the L-band (e.g., $\lambda_{L1}, \lambda_{L2}, \ldots \lambda_{Ln}$). Each of the laser emitters in a laser array of the wavelength-selectable laser device 204 may be modulated by a respective RF signal to generate the respective optical signals, and an optical multiplexer (e.g., AWG) may be used to combine the optical signals at the different respective channel wavelengths (e.g., $\lambda_{L1}, \lambda_{L2}, \ldots \lambda_{Ln}$). The branching point 218 may demultiplex the downstream aggregate WDM optical signal (e.g., $\lambda_{L1}, \lambda_{L2}, \ldots \lambda_{Ln}$) from the OLT 210 for transmission of the separate channel wavelengths to the respective ONUs/ONTs 212-1 to 212-n. Alternatively, the branching point 218 may provide the aggregate WDM optical signal to each of the ONUs/ONTs 212-1 to 212-n and each of the ONUs/ONTs 212-1 to 212-n separates and processes the assigned optical channel wavelength. The individual optical signals may be encrypted to prevent eavesdropping on optical channels not assigned to a particular ONU/ONT.

In the example embodiment, the wavelength-selectable laser device 202 in one or more of the ONUs/ONTs 212-1 to 212-n may generate an optical signal at a selected one of the channel wavelengths in the C-band (e.g., $\lambda_{C1}, \lambda_{C2}, \ldots \lambda_{Cn}$). In each wavelength-selectable laser device 202, a laser emitter associated with the selected one of the channel wavelengths in the C-band may be modulated to generate the optical signal. The branching point 218 combines or multiplexes the upstream optical signals from the respective ONUs/ONTs 212-1 to 212-n for transmission as an aggregate WDM optical signal over the trunk optical path 214 to the OLT 210.

Although examples of WDM systems are illustrated, wavelength-selectable laser devices, consistent with embodiments described herein, may also be used in other types of optical systems. A wavelength-selectable laser device may be used, for example, to scan across a range of wavelengths in spectroscopy applications to analyze different absorption characteristics of a gas.

Figure 3:
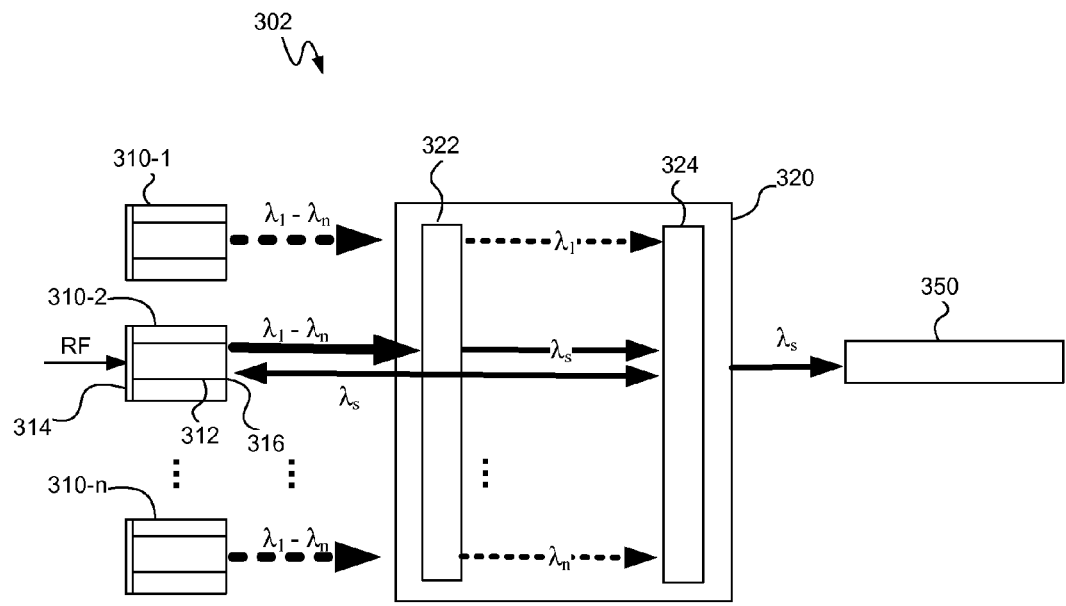
FIG. 3 is a schematic functional block diagram illustrating a wavelength-selectable laser device for transmitting a single selected channel wavelength, consistent with embodiments of the present disclosure.
Figure 4:
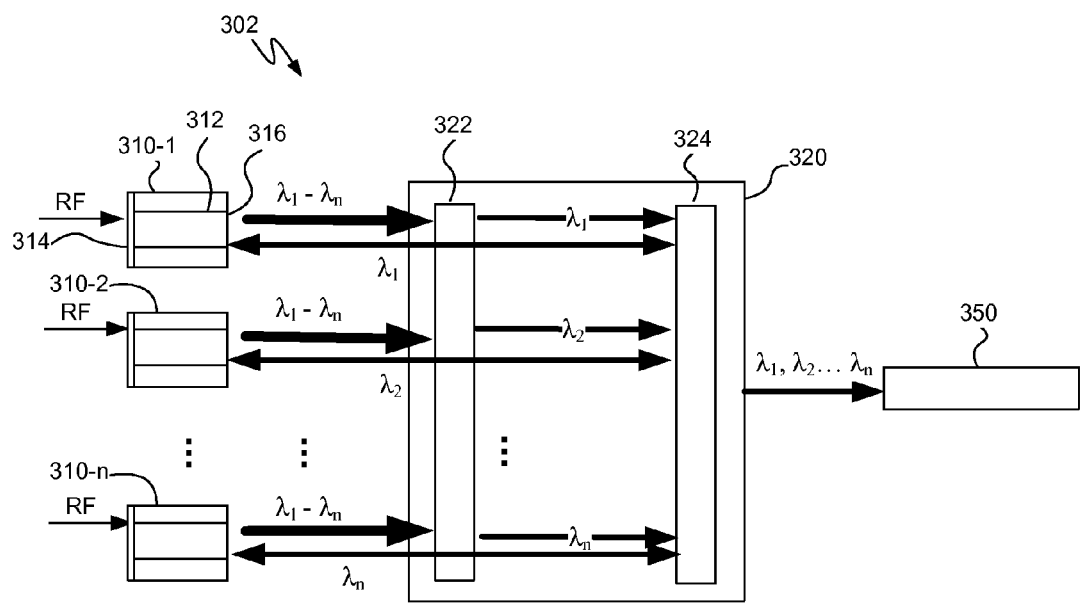
FIG. 4 is a schematic functional block diagram illustrating a wavelength-selectable laser device for transmitting a plurality of selected channel wavelengths, consistent with embodiments of the present disclosure.

FIGS. 3 and 4 illustrate operation of a wavelength-selectable laser device 302, consistent with embodiments of the present disclosure, for providing one or more selected channel wavelengths. The wavelength-selectable laser device 302 includes an array of laser emitters 310-1 to 310-n optically coupled to a filtered external cavity 320. Each of the laser emitters 310-1 to 310-n is configured to emit light across a range of wavelengths including, for example, the channel wavelengths (e.g., $\lambda_1$ to $\lambda_n$) of an optical communication system. The filtered external cavity 320 is configured to filter the light from one or more of the laser emitters 310-1 to 310-n at different wavelengths (e.g., $\lambda_1, \lambda_2, \ldots \lambda_n$) associated with the laser emitters, respectively, and to reflect the different wavelengths back to the respective laser emitters 310-1 to 310-n. A lasing cavity may thus be formed with the filtered external cavity 320 and one or more selected laser emitter 310-1 to 310-n such that lasing occurs at one or more selected channel wavelengths that are reflected back to the selected laser emitter(s).

By selectively emitting light from one or more of the laser emitters 310-1 to 310-n, the associated one or more channel wavelengths are selected for lasing and transmission. As shown in FIG. 3, for example, a single selected laser emitter 310-2 may be modulated with an electrical signal (e.g., an RF signal) without modulating the other laser emitters, thereby generating an optical signal at a single selected channel wavelength ($\lambda_s$) associated with that selected laser emitter 310-2. As shown in FIG. 4, a plurality of selected laser emitters 310-1 to 310-n may be modulated with electrical signals, thereby generating a plurality of optical signals at the selected channel wavelengths (e.g., $\lambda_1, \lambda_2 \ldots \lambda_n$) associated with those respective laser emitters 310-1 to 310-n.

The laser output provided from the filtered external cavity 320 may be coupled into an optical waveguide or fiber 350, for example, for transmission in an optical communication system such as a WDM system or WDM-PON. The wavelength-selectable laser device 302 may include other optical components (e.g., lenses and/or multiplexers) for coupling the laser output(s) from the filtered external cavity 320 into the waveguide or fiber 350. The selected wavelength(s) may be one or more channel wavelengths in a WDM-PON or other WDM system, such as the channel wavelengths defined by the ITU-T DWDM grid. The wavelength-selectable laser device 302 may thus be used in a tunable optical transmitter (e.g., in the ONT/ONUs of a WDM-PON), allowing universal, colorless transmitters capable of changing the selected wavelength without using conventional tunable lasers. The wavelengths-selectable laser device 302 may also be used in a multiple wavelength optical transmitter (e.g., in the OLT of a WDM-PON). By completing the lasing cavity after filtering at the channel wavelength(s) and lasing only at the selected channel wavelength(s), the tunable transmitters may be more efficient than transmitters including Fabry Perot (FP) lasers that lase across multiple channel wavelengths and then later filter and select a wavelength.

The laser emitters 310-1 to 310-n each include a gain region 312 for generating light across the range of wavelengths and amplifying the reflected light at the associated wavelength to provide the gain that results in lasing when the gain exceeds the cavity losses. The gain region 312 of each of the laser emitters 310-1 to 310-n may include a multiple quantum-well active region or other gain media capable of emitting a spectrum of light across a range of wavelengths and capable of amplifying light reflected back into the gain media. Each of the laser emitters 310-1 to 310-n may include, for example, a laser or gain chip such as a semiconductor or diode laser (e.g., a Fabry-Perot diode laser), a super-luminescent light emitting diode, or other light emitting modules. The laser emitters 310-1 to 310-n may also be integrated on a common substrate, for example, as an array of emitting areas from a gain region.

Each of the laser emitters 310-1 to 310-n also includes a back reflector 314 for reflecting at least a portion of the light from the gain region 312. The back reflector 314 may include a cleaved facet on a laser or gain chip and/or may include reflective or partially reflective coatings or distributed Bragg reflectors (DBRs) on the gain chip or separate from the gain chip. Each of the laser emitters 310-1 to 310-n may also include an anti-reflective coating 316 on an opposite side to allow light to pass into and out of the gain region 312. The anti-reflective coating 316 may have a reflectivity as small as possible (e.g., less than 1% reflective).

In this embodiment, the filtered external cavity 320 generally includes a dispersive optical element 322 and a front reflector 324. The dispersive optical element 322 disperses the light emitted from one or more of the laser emitters 310-1 to 310-n, separates different wavelengths (e.g., $\lambda_1, \lambda_2 \ldots \lambda_n$) of the light (e.g., based on an angle of incidence), and passes or reflects different wavelengths for each of the respective laser emitters toward the front reflector 324. The dispersive optical element 322 may include a diffraction grating such as a reflection grating or a transmission grating, a prism, or other dispersive optical elements capable of spatially separating different wavelengths of light. The front reflector 324 reflects the different wavelengths (e.g., $\lambda_1, \lambda_2 \ldots \lambda_n$) back to the respective laser emitters 310-1 to 310-n. When one or more laser emitters 310-1 to 310-n are selectively modulated, therefore, a lasing cavity is formed between the front reflector 324 and the back reflector 314 of the selected laser emitter(s) and including the gain region 312 of the selected laser emitter(s).

In the illustrated embodiments, the back reflector 314 is highly reflective (e.g., at least about 80% reflectivity) and the front reflector 324 is sufficiently partially reflective (e.g., about 50% reflectivity) to achieve lasing such that laser light output passes through the front reflector 324 and exits from the filtered external cavity 320 when lasing occurs. The front reflector 324 thus acts as an exit mirror that completes the laser cavity. Although the illustrated embodiments show the laser output at the selected wavelength(s) from the filtered external cavity 320, the laser output may also be provided from the laser emitters 310-1 to 310-n, for example, by using a partially reflective back reflector 314 and a highly reflective front reflector 324.

Figure 5:
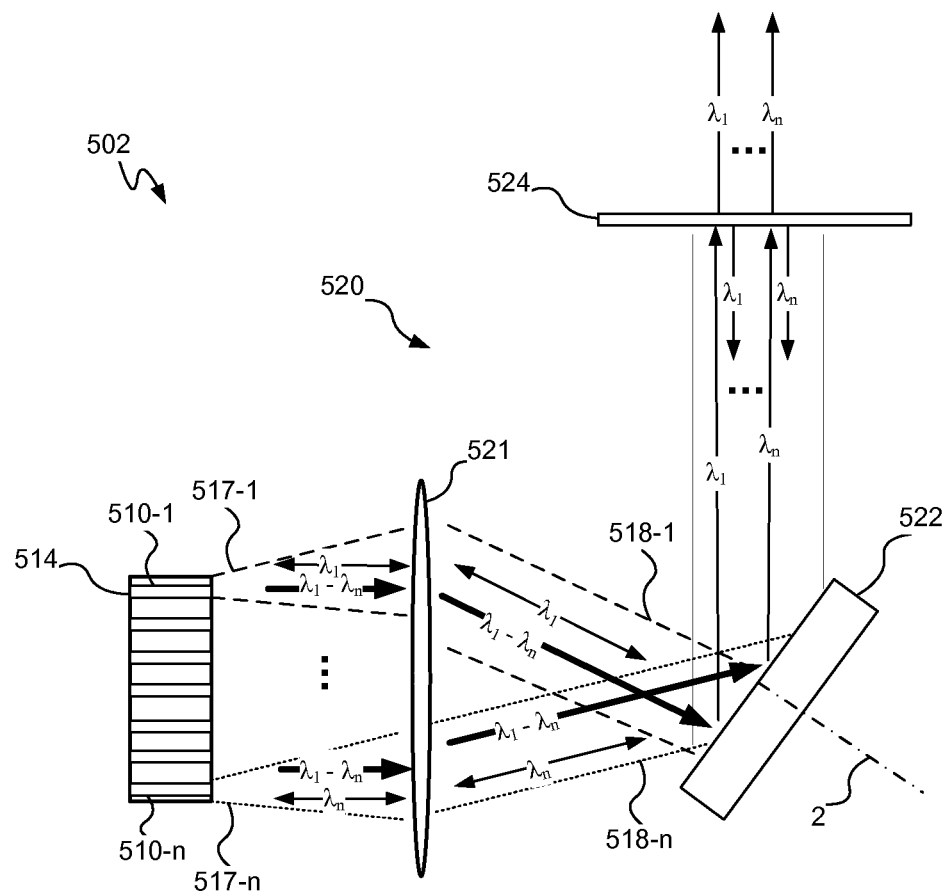
FIG. 5 is a schematic diagram of an embodiment of a wavelength-selectable laser device for providing one or more selected channel wavelengths.

Referring to FIG. 5, an embodiment of a wavelength-selectable laser device 502 is shown and described in greater detail. In this embodiment, the wavelength-selectable laser device 502 includes an array of laser emitters 510-1 to 510-n, which share a common substrate (i.e., a gain region with multiple emitting areas). In other embodiments, the laser emitters 510-1 to 510-n may be an array of separate, individual gain chips. Each of the laser emitters 510-1 to 510-n may be identical and may include a back reflector 514 on the individual laser emitters or across the entire array of laser emitters. The number of laser emitters 510-1 to 510-n may correspond to the number of channel wavelengths in the optical system or network (e.g., 32 laser emitters for 32 channels). Each of the laser emitters 510-1 to 510-n emit light across a range of wavelengths including the channel wavelengths (e.g., $\lambda_1$ to $\lambda_n$).

In this embodiment of the wavelength-selectable laser device 502, the filtered external cavity 520 includes a lens 521, a diffraction grating 522, and a partially-reflective mirror 524. The lens 522 may be located in front of the array of laser emitters 510-1 to 510-n to receive and pass the light beams 517-1 to 517-n emitted from the respective laser emitters 510-1 to 510-n across the range of wavelengths (e.g., $\lambda_1$ to $\lambda_n$). The lens 521 substantially or approximately collimates the light beams 517-1 to 517-n and directs the substantially collimated beams 518-1 to 518-n to the diffraction grating 522 at different angles relative to an axis 2 of the diffraction grating 522. Although a single lens 521 is shown, multiple lenses and/or other optical components may be used to direct the light beams to the diffraction gating 522 in a similar manner. In other embodiments, separate laser emitters may be angled to direct the light at different angles relative to the diffraction grating 522.

The diffraction grating 522 separates the light incident on the diffraction grating 522 into different wavelengths and reflects the different wavelengths at different angles. Because each of the light beams 518-1 to 518-n from the respective laser emitters 510-1 to 510-n are incident on the diffraction grating 522 at different angles, the diffraction grating 522 reflects a different wavelength in the direction of the mirror 524 for each of the laser emitters 510-1 to 510-n. The diffraction grating 522 is positioned relative to the lens 521 and the partially-reflective mirror 524 such that the diffraction grating 522 reflects the different channel wavelengths (e.g., $\lambda_1, \lambda_2 \ldots \lambda_n$) from each of the light beams 518-1 to 518-n toward the partially-reflective mirror 524 at approximately a right angle relative to the mirror 524. The light beam 518-1 from the laser emitter 510-1, for example, includes a range of wavelengths (e.g., $\lambda_1$ to $\lambda_n$) but the diffraction grating 522 reflects the associated channel wavelength ($\lambda_1$) toward the partially-reflective mirror 524. Other dispersive optical elements capable of reflecting or transmitting light beams with different wavelengths may also be used.

The partially-reflective mirror 524 may be located relative to the diffraction grating 522 such that the light at the channel wavelengths are reflected from the mirror 524 back to the diffraction grating 522. Thus, one or more lasing cavities may be formed between the mirror 524 and the back reflector 514 of one or more respective selected laser emitters 510-1 to 510-n such that lasing occurs at the reflected channel wavelength(s). The partially-reflective mirror 524 is sufficiently reflective to achieve lasing at the reflected wavelength(s) (e.g., $\lambda_1, \lambda_2 \ldots \lambda_n$) but transmits at least a portion of the light beams when lasing occurs, allowing light beams at the one or more wavelengths (e.g., $\lambda_1, \lambda_2 \ldots \lambda_n$) to exit.

In operation, spontaneously emitted light from one or more of the laser emitters 510-1 to 510-n is diffracted by the diffraction grating 522 and reflected from the mirror 524 back to the diffraction grating 522. The light reflected back to the diffraction grating 522 is once again diffracted and emerges from the diffraction grating 522 at an angle that is different depending on the wavelength of the light. The lens 521 then focuses these light beams back onto the respective laser emitters 510-1 to 510-n, depending on their wavelength. In this way, the optical cavity formed between the respective one of the laser emitters 510-1 to 510-n and the mirror 524 supports optical amplification only at those wavelengths where the laser emitters are present at the appropriate wavelengths. By selectably electrically powering one or more of the laser emitters 510-1 to 510-n (e.g., biasing only one gain element), the wavelength-selectable laser device 502 is able to emit light at any one of the associated channel wavelengths, or at any combination of the wavelengths. Thus, channel wavelengths may be selected without moving the diffraction grating 522 or mirror 524.

Accordingly, a wavelength-selectable laser device, consistent with embodiments of the present disclosure, may be used advantageously in tunable optical transmitters or transceivers that transmit optical signals at a selected channel wavelength and/or in optical transmitters or transceivers that transmit multiplexed optical signals at a plurality of channel wavelengths. The wavelength-selectable laser devices described herein are relatively inexpensive and relatively stable over time (e.g., compared to continuously-tunable laser sources)

because moving parts are not required for continuous tuning of the laser. Using a dispersive optical element to separate the wavelengths such that lasing occurs only at selected channel wavelength(s) also avoids using complicated wavelength locking and controls.

Consistent with one embodiment, a wavelength-selectable laser device includes an array of laser emitters and a filtered external cavity coupled to the laser emitters. Each of the laser emitters includes a gain region for emitting light across a range of wavelengths including a plurality of channel wavelengths and a back reflector for reflecting light from the laser emitters. The filtered external cavity is configured to filter light received from respective ones of the laser emitters at different respective channel wavelengths for the respective ones of the laser emitters and configured to reflect at least a portion of the light at the respective channel wavelengths back to the gain region in the respective ones of the laser emitters. A lasing cavity is formed with the filtered external cavity and at least one selected laser emitter of the laser emitters and lasing occurs at respective at least one selected channel wavelength(s) reflected back to the gain region of the at least one selected laser emitter.

Consistent with another embodiment, a wavelength-selectable laser device includes an array of laser emitters and a lens for receiving the light emitted from the laser emitters, respectively, and for directing the light from respective ones of the laser emitters at different angles. Each of the laser emitters include a gain region for emitting light across a range of wavelengths including a plurality of channel wavelengths and a back reflector for reflecting light from the laser emitters. A dispersive optical element is configured to receive light from the respective ones of the laser emitters at the different angles and configured to reflect or pass different channel wavelengths of the light at different angles. A front reflector is configured to receive a different channel wavelength passed or reflected by the dispersive optical element for each of the respective ones of the laser emitters and configured to reflect the different channel wavelengths, respectively, back to the gain region in the respective ones of the laser emitters such that a lasing cavity is formed between the front reflector and the back reflector of at least one selected laser emitter of the laser emitters and lasing occurs at respective at least one selected channel wavelength(s) reflected back to the gain region of the at least one selected laser emitter.

Consistent with a further embodiment, a wavelength division multiplexed (WDM) system includes a plurality of terminals associated with different respective channel wavelengths and configured to transmit optical signals on the different respective channel wavelengths. At least one of the plurality of terminals includes at least a tunable optical transmitter configured to be tuned to a respective one of the channel wavelengths. The tunable optical transmitter includes a wavelength-selectable laser device configured to transmit an optical signal at the selected one of the channel wavelengths. The wavelength-selectable laser device includes an array of laser emitters and a filtered external cavity coupled to the laser emitters. Each of the laser emitters includes a gain region for emitting light across a range of wavelengths including a plurality of channel wavelengths and a back reflector for reflecting light from the laser emitters. The filtered external cavity is configured to filter light received from respective ones of the laser emitters at different respective channel wavelengths for the respective ones of the laser emitters and configured to reflect at least a portion of the light at the respective channel wavelengths back to the gain region in the respective ones of the laser emitters. A lasing cavity is formed with the filtered external cavity and at least one selected laser emitter of the laser emitters and lasing occurs at respective at least one selected channel wavelength(s) reflected back to the gain region of the at least one selected laser emitter.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A wavelength-selectable laser device, comprising:
    an array of laser emitters, each of the laser emitters including a gain region for emitting light across a range of wavelengths including a plurality of channel wavelengths and a back reflector for reflecting light from the laser emitters, wherein each of the laser emitters is associated with a single channel wavelength; and
    a filtered external cavity coupled to the laser emitters, the filtered external cavity being configured to filter light received from respective ones of the laser emitters at different respective channel wavelengths for the respective ones of the laser emitters and configured to reflect at least a portion of the light at the respective channel wavelengths back to the gain region in the respective ones of the laser emitters such that a lasing cavity is formed with the filtered external cavity and at least one selected laser emitter of the laser emitters and lasing occurs at respective at least one selected channel wavelength(s) reflected back to the gain region of the at least one selected laser emitter, wherein only the single channel wavelength associated with a respective one of the laser emitters is reflected back to the respective one of the laser emitters for lasing;
    wherein the filtered external cavity comprises:
    a dispersive optical element configured to receive multiple light beams emitted from the respective ones of the laser emitters such that each of the light beams is incident on the dispersive optical element at different angles to reflect or pass different channel wavelengths within each of the light beams at different angles; and
    a front reflector configured to receive a different channel wavelength passed or reflected by the dispersive optical element for each of the respective ones of the laser emitters and configured to reflect the different channel wavelengths, respectively, back to the gain region in the respective ones of the laser emitters such that the lasing cavity is formed between the front reflector and the back reflector of the at least one selected laser emitter.

2. The wavelength-selectable laser device of claim 1 wherein the filtered external cavity further comprises a lens for receiving the light emitted from the laser emitters, respectively, and for directing the light from the respective ones of the laser emitters at different angles toward the dispersive optical element.

3. The wavelength-selectable laser device of claim 1 wherein the dispersive optical element includes a diffraction grating configured to reflect the light such that the different channel wavelengths for the respective ones of the laser emitters are reflected to the front reflector.

4. The wavelength-selectable laser device of claim 1 wherein the front reflector is partially-reflective such that such that laser output at the selected channel wavelength(s) exits the lasing cavity through the front reflector.

5. The wavelength-selectable laser device of claim 4 wherein the back reflector of each of the laser emitters is highly reflective, and wherein each of the laser emitters is anti-reflective on an opposite side.

6. The wavelength-selectable laser device of claim 1 wherein the laser emitters include Fabry Perot (FP) laser emitters.

7. The wavelength-selectable laser device of claim 1 wherein the array of laser emitters is configured to emit light from one selected laser emitter such that lasing occurs at a selected channel wavelength associated with the one selected laser emitter.

8. The wavelength-selectable laser device of claim 1 wherein the array of laser emitters is configured to emit light from a plurality of selected laser emitters such that lasing occurs at a plurality of selected channel wavelengths associated with the plurality of selected laser emitters.

9. The wavelength-selectable laser device of claim 1 wherein the array of laser emitters share a common substrate.

10. A wavelength-selectable laser device, comprising:
    an array of laser emitters, each of the laser emitters including a gain region for emitting light across a range of wavelengths including a plurality of channel wavelengths and a back reflector for reflecting light from the laser emitters, wherein each of the laser emitters is associated with a single channel wavelength;
    a lens for receiving the light emitted from the laser emitters, respectively, and for directing the light from respective ones of the laser emitters at different angles;
    a dispersive optical element configured to receive multiple light beams emitted from the respective ones of the laser emitters such that each of the light beams is incident on the dispersive optical element at the different angles to reflect or pass different channel wavelengths within each of the light beams at different angles; and
    a front reflector configured to receive a different channel wavelength passed or reflected by the dispersive optical element for each of the respective ones of the laser emitters and configured to reflect the different channel wavelengths, respectively, back to the gain region in the respective ones of the laser emitters such that a lasing cavity is formed between the front reflector and the back reflector of at least one selected laser emitter of the laser emitters and lasing occurs at respective at least one selected channel wavelength(s) reflected back to the gain region of the at least one selected laser emitter, wherein only the single channel wavelength associated with a respective one of the laser emitters is reflected back to the respective one of the laser emitters for lasing.

11. The wavelength-selectable laser device of claim 10 wherein the dispersive optical element is a reflective diffraction grating.

12. The wavelength-selectable laser device of claim 10 wherein the array of laser emitters share a common substrate.

13. The wavelength-selectable laser device of claim 10 wherein the front reflector is sufficiently partially reflective to achieve lasing.

14. A wavelength division multiplexed (WDM) system comprising:
    a plurality of terminals associated with different respective channel wavelengths and configured to transmit optical signals on the different respective channel wavelengths, at least one of the plurality of terminals including at least a tunable optical transmitter configured to be tuned to a respective one of the channel wavelengths, the tunable optical transmitter comprising a wavelength-selectable laser device configured to transmit an optical signal at the selected one of the channel wavelengths, the laser device comprising:
        an array of laser emitters, each of the laser emitters including a gain region for emitting light across a range of wavelengths including a plurality of channel wavelengths and a back reflector for reflecting light from the laser emitters, wherein each of the laser emitters is associated with a single channel wavelength; and
        a filtered external cavity coupled to the laser emitters, the filtered external cavity being configured to filter light received from respective ones of the laser emitters at different respective channel wavelengths for the respective ones of the laser emitters and configured to reflect at least a portion of the light at the respective channel wavelengths back to the gain region in the respective ones of the laser emitters such that a lasing cavity is formed with the filtered external cavity and at least one selected laser emitter of the laser emitters and lasing occurs at respective at least one selected channel wavelength(s) reflected back to the gain region of the at least one selected laser emitter, wherein only the single channel wavelength associated with a respective one of the laser emitters is reflected back to the respective one of the laser emitters for lasing;
    wherein the filtered external cavity comprises:
        a dispersive optical element configured to receive multiple light beams emitted from the respective ones of the laser emitters such that each of the light beams is incident on the dispersive optical element at different angles to reflect or pass different channel wavelengths within each of the light beams at different angles; and
        a front reflector configured to receive a different channel wavelength passed or reflected by the dispersive optical element for each of the respective ones of the laser emitters and configured to reflect the different channel wavelengths, respectively, back to the gain region in the respective ones of the laser emitters such that the lasing cavity is formed between the front reflector and the back reflector of the at least one selected laser emitter.

15. The WDM system of claim 14 wherein the plurality of terminals include optical networking terminals (ONTs) in a WDM passive optical network (PON).

16. The WDM system of claim 14 further comprising:
    at least one optical line terminal (OLT) configured to receive aggregate WDM optical signals including the channel wavelengths;
    at least one branching point coupled between the OLT and the plurality of terminals, the branching point being configured to combine the optical signals at the channel wavelengths; and
    a trunk optical path coupling the OLT and the branching point.

17. The WDM system of claim 14 wherein the channel wavelengths include wavelengths in the C-band.

18. The WDM system of claim 14 wherein the filtered external cavity further comprises a lens for receiving the light emitted from the laser emitters, respectively, and for directing the light from the respective ones of the laser emitters at different angles toward the dispersive optical element.

* * * * *